(12) United States Patent
Morita et al.

(10) Patent No.: US 7,126,335 B2
(45) Date of Patent: Oct. 24, 2006

(54) NUCLEAR MAGNETIC RESONANCE MEASURING APPARATUS

(75) Inventors: Hiroshi Morita, Mito (JP); Michiya Okada, Mito (JP); Masae Kiryu, Hitachi (JP); Hiromitsu Seino, Iwaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/253,574

(22) Filed: Oct. 20, 2005

(65) Prior Publication Data

US 2006/0038567 A1 Feb. 23, 2006

Related U.S. Application Data

(63) Continuation of application No. 10/791,806, filed on Mar. 4, 2004, now Pat. No. 7,030,613.

(30) Foreign Application Priority Data

Sep. 30, 2003 (JP) ............................. 2003-340574

(51) Int. Cl.
*G01V 3/00* (2006.01)

(52) U.S. Cl. ....................... 324/318; 62/47.1

(58) Field of Classification Search ................ 324/318, 324/321, 315; 62/47.1, 48.4; 335/300, 299; 505/892, 90
See application file for complete search history.

(56) References Cited

U.S. PATENT DOCUMENTS 5,247,256 A 9/1993 Marek

| | | |
|---|---|---|
| 5,508,613 A | 4/1996 | Kotsubo |
| 5,545,998 A * | 8/1996 | Favre et al. ................ 324/321 |
| 5,889,456 A | 3/1999 | Triebe |
| 5,913,888 A | 6/1999 | Steinmeyer |
| 6,525,537 B1 | 2/2003 | Nerreter |

FOREIGN PATENT DOCUMENTS

JP 10-332801 12/1998

OTHER PUBLICATIONS

H. Arata, Marunzen Co., Ltd., 2000, Book of NMR, Part III, Measuring Technology pp. 325-327.

* cited by examiner

*Primary Examiner*—Louis M. Arana
(74) *Attorney, Agent, or Firm*—Antonelli, Terry, Stout and Kraus, LLP.

(57) ABSTRACT

A nuclear magnetic resonance measuring apparatus includes an NMR probe head equipped with an NMR receiver coil and an irradiation coil, a preamplifier, for amplifying the NMR signal received by the NMR receiver coil, a coil cooling heat exchanger, for exchanging heat between the NMR receiver coil/irradiation coil and coolant, a preamplifier heat exchanger for exchanging heat between the preamplifier and the coolant, and a cooling device capable of cooling and compressing the coolant. Further, a first transfer tube is provided for transferring the coolant from the cooling device to the probe head, a second transfer tube for transferring the coolant from the probe head to the cooling device, a third transfer tube for transferring the coolant from the cooling device to the probe head, and a fourth transfer tube for transferring the coolant from the probe head to the cooling device.

23 Claims, 11 Drawing Sheets

NUCLEAR MAGNETIC RESONANCE MEASURING APPARATUS

CROSS-REFERENCE TO RELATED APPLICATION

This application is a continuation of U.S. application Ser. No. 10/791,806, filed Mar. 4, 2004, now U.S. Pat. No. 7,030,613, the subject matter of which is incorporated by reference herein.

BACKGROUND OF THE INVENTION

Field of the Invention

The present invention relates to a nuclear magnetic resonance measuring apparatus where the Q value and signal-to-noise ratio of an irradiation coil and receiver coil can be improved by cooling the irradiation coil and receiver coil in a probe head, and a preamplifier.

The nuclear magnetic resonance measuring apparatus (hereinafter referred to as "NMR apparatus") generally includes a CW type (continuous wave type) that applies an electromagnetic wave of radio frequency signal to a sample on a continuous basis, and a pulse Fourier type that applies pulse-like electromagnetic waves to the sample. In recent years, the NMR apparatus more often refers to the latter pulse Fourier type apparatus. In the present specification for patent application, it refers to the pulse Fourier type NMR apparatus, unless otherwise specified.

The basic configuration of the NMR apparatus is described in the "Part III, Measuring Technology" of "A Book on NMR" (by H. Arata, Maruzen Co., Ltd., 2000). According to this publication, the NMR apparatus comprises a superconducting magnet for generating a static magnetic field, an irradiation coil for applying a magnetic field of high frequency pulse to a sample stored inside, a receiver coil for receiving a free induction decay signal (FID signal) issued from the sample, a probe head with the aforementioned coil incorporated inside, a high frequency power supply for supplying a high frequency current to the irradiation coil, an amplifier for amplifying the free induction decay signal, a wave detector for detecting signals and an analyzer for analyzing the signal detected by the wave detector by the detector.

To meet the requirements of a wide variety of nuclear species and measuring methods, the irradiation coil and receiver coil is provided with a probe head equipped with multiple coils. Some coils incorporate the functions of both the irradiation coil and receiver coil. These coils are collectively called a probe coil.

One type of the probe head includes a cryogenic probe. According to the aforementioned "A Book on NMR", the cryogenic probe refers to the probe head that superconducts the probe coil and cools the inside of the cryogenic probe by means of cryogenic helium gas. An oxide superconductor is commonly used as a superconductor.

The cryogenic probe has two advantages: One is that the selectivity Q of the coil is high since the electric resistance of the circuit can be reduced. The coil selectivity Q can be expressed by Equation (1).

$$Q = \sqrt{\frac{L}{C}} \frac{1}{R} \tag{1}$$

Here L denotes an inductance, C a capacitance and R a resistance. Equation (1) shows that the value Q increases as electric resistance R decreases. Another advantage is that use of cryogenic temperature reduces the thermal noise of the entire circuit, and the signal-to-noise ratio is therefore improved. Noise voltage Vn can be represented by Equation (2).

$$V_n = \sqrt{4kT\Delta f R} \tag{2}$$

Here k denotes a Boltzmann constant, T a temperature, $\Delta f$ a frequency range and R an electric resistance. Equation (2) shows that noise voltage $V_n$ increases as temperature T decreases. In the general metal, resistance R decreases with temperature T. Thus, noise voltage $V_n$ can be reduced at a rate of ½-th power of R or more by cooling inside the probe head and superconducting the probe coil.

The art of cooling to realize a cryogenic probe by cooling inside the probe head is disclosed in the JP Patent No. 2947348, according to which the temperature of a receiver coil can be reduced below 30 K by a simple method without much technical difficulty and cost.

SUMMARY OF THE INVENTION

However, the aforementioned Patent Document 1 (No. 2947348) has the following problems: When the coolant is circulated by the compressor, pressure is reduced by the friction between coolant and coolant path. This is called pressure loss. The pressure loss of fluid in the state of turbulent flow in a smooth circular tube can be calculated from the Pladius's resistance formula.

$$\lambda = 0.1364 \, Re^{-\frac{1}{4}} \tag{3}$$

Here $\lambda$ indicates a tube friction coefficient and Re a Reynolds number.

Pressure loss $\Delta p$ can be calculated from Equation (4).

$$\Delta p = \lambda \left(\frac{\rho u^2}{2}\right)\left(\frac{L}{D}\right) \tag{4}$$

Here $\rho$ is the density of fluid (kg/mm³), u the average flow rate of the fluid (m/s), L the length of a circular tube (m) and D the diameter of the circular tube (m). The average flow rate u is obtained from Equation (5).

$$u = \frac{\dot{m}}{\left(\frac{D}{2}\right)^2 \pi \rho} \tag{5}$$

Here m indicates the mass flow rate (kg/s).

For example, assume that helium is used as a fluid, and is fed through a circular tube having a length of 10 m and a diameter of 0.003 m under a pressure of 1 MPa at a mass flow rate of 0.001 kg/s. Then pressure loss at temperatures of 300 K and 5 K is as shown in Table 1.

TABLE 1

Fluid: helium, Pressure: 1 MPa,
Mass flow rate: 0.001 kg/s
Circular tube: 10 m long, 0.003 in diameter

| Temperature (K) | Pressure loss (MPa) |
|---|---|
| 300 | 0.55 |
| 5 | 0.0042 |

Pressure loss in Table 1 does not take into account the reduction in density resulting from pressure loss at some midpoint in the cylindrical tube. The experiment value of the pressure loss is therefore greater than that. The pressure loss at 5 K is reduced to one hundredth that at 300 K.

Conditions for the fluid and cylindrical tube shown in Table 1 can be achieved in an apparatus according to the JP Patent No. 2947348, where coolant is circulated by a compressor and cryogenic probe is cooled.

Let us further assume that the path for the coolant cooled down to 5 K is 10 m long after a sufficient time has passed subsequent to the operation start of the aforementioned apparatus. Here let us ignore the pressure loss in the section of 5 K or more before and after. In this case, helium discharged at 1 MPA in the compressor is again sucked into the compressor at 0.9958 MPa.

When the aforementioned 10 m-long flow path has a temperature of 300 K, the helium discharged after having been compressed to 1 MPa by the compressor is again sucked into the compressor. There is no big problem in the latter case.

In the compressor commonly called a displacement compressor, unless the compression ratio is increased about twice or more, a sufficient flow rate cannot be obtained. Not only that, the compressor may be damaged during the operation. There is a problem in the former case.

In the U.S. Pat. No. 2,947,348, a valve for controlling the mass flow rate is provided in the flow path. This is intended to control the flow rate of the coolant running in each path to ensure that coolant branches off to provide effective cooling of two positions simultaneously, but is not sufficient to control the ratio between the compressor delivery pressure and suction pressure. Thus, in the apparatus disclosed in the U.S. Pat. No. 2,947,348, a required flow rate of the coolant cannot be obtained. Not only that, the compressor may be damaged during the operation.

One aspect of the present invention is a nuclear magnetic resonance measuring apparatus comprising:

an NMR probe head equipped with an NMR receiver coil and an irradiation coil;

a preamplifier, arranged in said probe head, for amplifying the NMR signal received by said NMR receiver coil;

a coil cooling heat exchanger, arranged in said probe head, for exchanging heat between said NMR receiver coil/irradiation coil and coolant;

a preamplifier, arranged inside said probe head, for exchanging heat between said preamplifier and coolant;

a cooling device capable of cooling and compressing the coolant;

a first transfer tube for transferring the coolant from said cooling device to said probe head;

a second transfer tube for transferring the coolant from said probe head to said cooling device;

a third transfer tube for transferring the coolant from said cooling device to said probe head; and a fourth transfer tube for transferring the coolant from said probe head to said cooling device;

said nuclear magnetic resonance measuring apparatus further characterized in that:

said cooling device further comprises:

a cryo-cooler further containing a first cooling stage having a first stage heat exchanger and a second cooling stage having a second stage heat exchanger;

a compressor for compressing the coolant;

a first counter-flow heat exchanger and a second counter-flow heat exchanger;

said first cooling stage has a first stage temperature higher than the second stage temperature of said second cooling stage;

said compressor is capable of circulating the coolant via the path consisting of said first counter-flow heat exchanger, first stage heat exchanger, third transfer tube, preamplifier heat exchanger, fourth transfer tube, second counter-flow heat exchanger, second stage heat exchanger, first transfer tube, coil cooling heat exchanger, second transfer tube, second counter-flow heat exchanger and first counter-flow heat exchanger, in that order; and pressure control valves that all the amount of coolant passes through are arranged in series in at least one position along said coolant circulating path and are capable of reducing the pressure of the coolant passing through said pressure control valves.

DETAILED DESCRIPTION OF THE INVENTION

Figure 1:
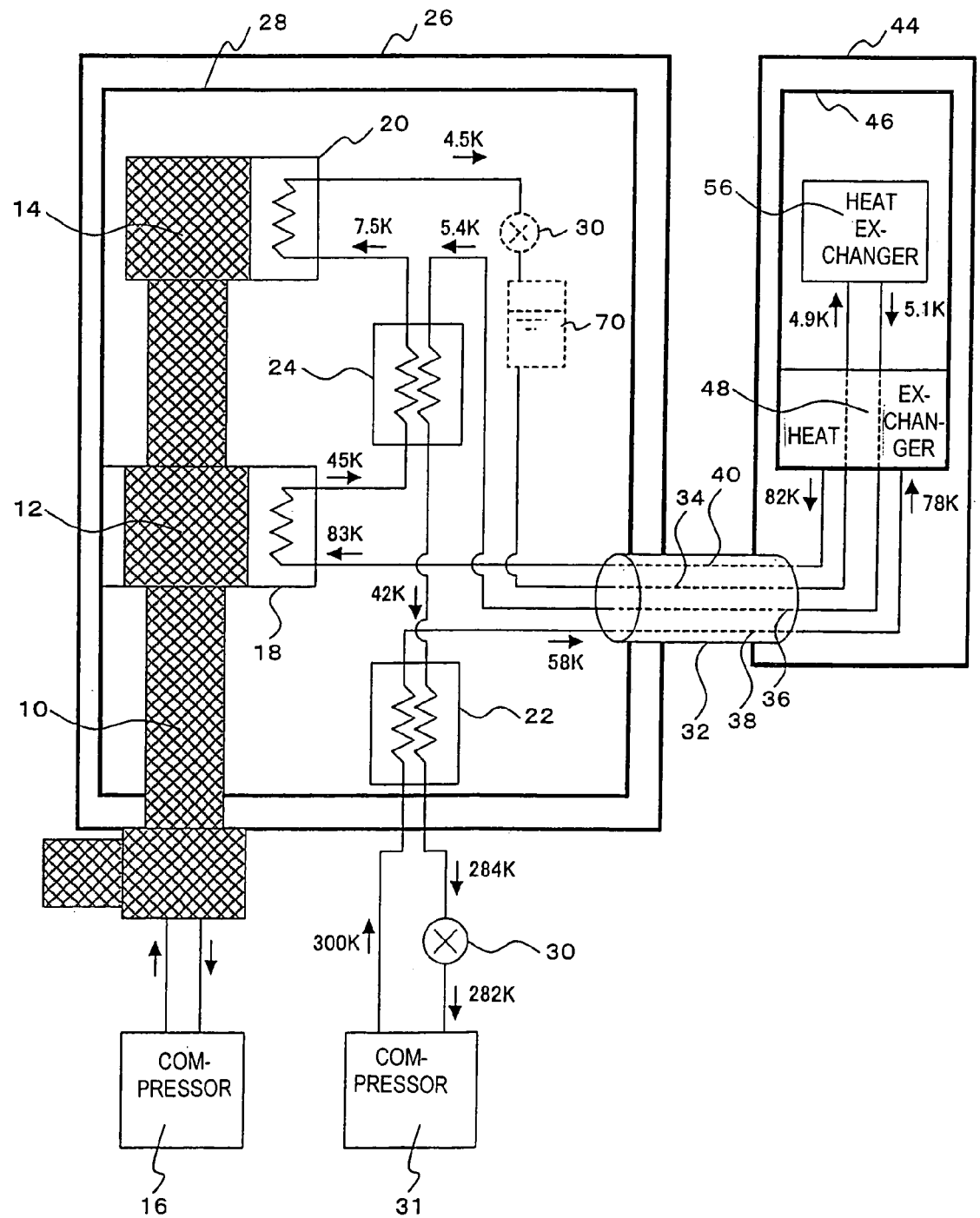
FIG. 1 is a drawing representing a first embodiment of the present invention.

FIG. 1 is a block diagram representing an embodiment of the present invention. A cryo-cooler 10 contains a first cooling stage 12 and a second cooling stage 14, and is driven by a cryo-cooler compressor 16. The first cooling stage 12 is thermally connected with a first stage heat exchanger 18, and the second cooling stage 14 is thermally connected with a second stage heat exchanger 20. The first stage heat exchanger 18 is capable of cooling the coolant down to 45 K, and the second stage heat exchanger 20 down to 4.5 K.

A first counter-flow heat exchanger 22, first stage heat exchanger 18, second counter-flow heat exchanger 24 and second stage heat exchanger are installed in the radiation shield 28 incorporated in a vacuum container 26. The counter-flow heat exchanger has heat exchanging units characterized by opposite flow directions.

The radiation shield 28 is thermally connected with the first cooling stage 12 of the cryo-cooler 10. A vacuum is maintained inside the vacuum container 26. A superinsulator as a multi-heat insulating layer is wound outside the radiation shield 28, thereby reducing the radiation heat applied to the equipment inside the radiation shield 28.

Coolant is circulated in the order of a compressor 31, first counter-flow heat exchanger 22, third transfer tube 38, preamplifier heat exchanger 48, fourth transfer tube 40, first stage heat exchanger 18, second counter-flow heat exchanger 24, second stage heat exchanger 20, first transfer tube 34, coil cooling heat exchanger 56, second transfer tube 36, second counter-flow heat exchanger 24, first counter-flow heat exchanger 22, pressure control valve 30 and compressor 31.

The pressure control valve 30 has the coolant located at the inlet of the compressor 31 at a room temperature, and can be adjusted to a desired opening angle in the range from 0 to 100%.

Figure 2:
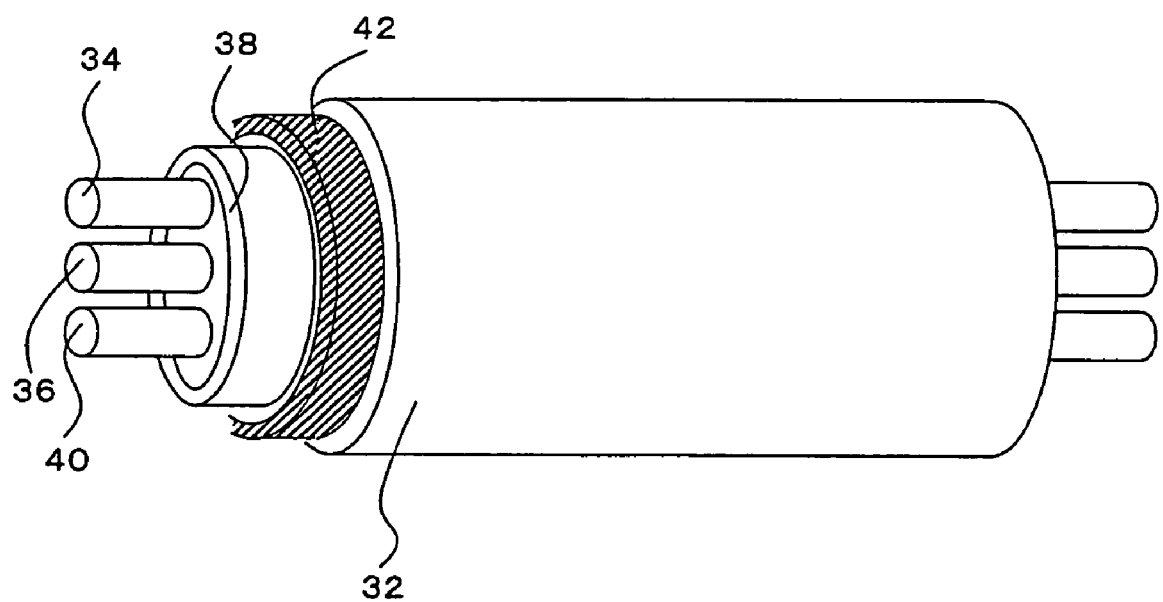
FIG. 2 is a drawing representing the embodiment of a transfer tube and its storage conduit.

The transfer tube storage conduit 32 and its interior have the structure as shown in the detailed drawing of FIG. 2. The first transfer tube 34, second transfer tube 36, third transfer tube 38 and fourth transfer tube 40 are installed in a single transfer tube storage conduit 32. The third transfer tube 38 is a double tube, and coolant flows through the space between its outside and inner tubes.

In the third transfer tube 38, the first transfer tube 34, second transfer tube 36 and fourth transfer tube 40 are installed. A superinsulator as a multi-heat insulating layer 42 is disposed outside of the transfer tube, thereby reducing the radiation heat applied inside the transfer tube.

A vacuum is created inside transfer tube storage conduit 32 to reduce entry of heat into the transfer tube due to gas convection and heat conduction. A radiation shield 46 is installed inside the probe 44 shown in FIG. 1. A vacuum is maintained in the probe 44 and a superinsulator as a multi-heat insulating layer is wound outside the radiation shield 46 (not illustrated), thereby reducing the radiation heat applied to the equipment inside the radiation shield 46. The radiation shield 46 is thermally connected with the preamplifier heat exchanger 48.

Figure 10:
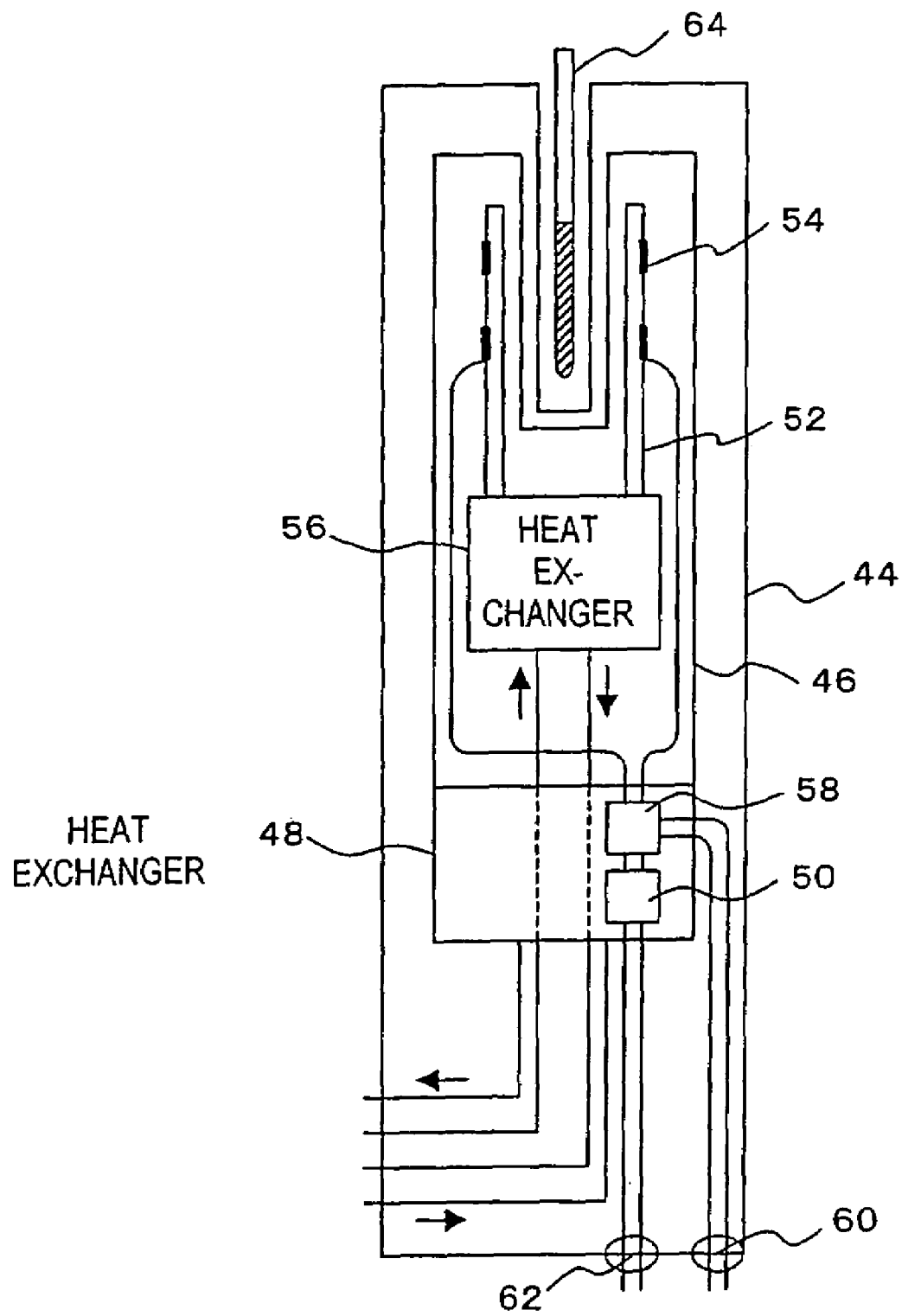
FIG. 10 is a drawing representing the embodiment inside the probe.

FIG. 10 shows an example of the internal configuration of the probe 44. The radiation shield 46 is thermally connected with the preamplifier heat exchanger 48. The preamplifier 50 is thermally connected with the preamplifier heat exchanger 48 through the probe coil cooling heat transfer unit 52.

There is thermal connection between the NMR probe coil 54 and coil cooling heat exchanger 56. More preferably, the preamplifier heat exchanger 48 should thermally be connected with a regulator circuit 58. FIG. 10 indicates the NMR probe coil 54 having the functions of both irradiation and reception.

It is also possible to arrange a plurality of the NMR probe coils 54 separately for irradiation and reception. The NMR probe coil 54 and regulator circuit 58, regulator circuit 58 and preamplifier 50, regulator circuit 58 and high frequency pulse input terminal 60, and preamplifier 50 and FID signal output terminal 62 respectively are electrically connected with each other.

When the high frequency pulse magnetic field is applied to a sample, the high frequency pulse current generated from the high frequency power supply outside the probe is supplied to the NMR probe coil 54 through the FID signal output terminal 62 and regulator circuit 58, and is applied to the sample in the sample tube 64 as a magnetic field.

If the high frequency pulse current is input into the preamplifier 50, the preamplifier 50 may be damaged. To avoid this possibility, a regulator circuit 58 is configured in such a fashion that high frequency pulse current will not enter the preamplifier 50.

The FID signal emitted from the sample is received by the NMR probe coil 54 and is input into the regulator circuit 58 as an electric signal. It is amplified by the preamplifier 50 and is fed to the amplifier, wave detector and analyzer outside the probe via the FID signal output terminal 62. The regulator circuit 58 can be a circuit where switching is effected passively by the flow of high frequency pulse current, or a circuit where switching is provided by an external trigger signal.

In the former case, the circuit can be exemplified by one using a cross diode. In the latter case, it is also possible to use a PIN diode switch and mechanical high-speed switch.

It is preferred that the regulator circuit 58 include a desired capacitance and inductance to provide consistency in resonance frequency and impedance of the circuit in the NMR probe. It is also possible to make such arrangements that a circuit containing capacitance and inductance is arranged in the regulator circuit 58 so that one NMR probe coil 54 can provide multiple resonance; namely, one coil can generate the high frequency pulse magnetic field of resonance frequency of a plurality of nuclei.

The regulator circuit 58 and preamplifier 50 are cooled to a low temperature in order to avoid thermal noise. When thermal noise is not taken into account in particular, they can be kept at the normal temperature. In FIG. 10, one NMR probe coil 54 performs the functions of both irradiation and reception. It is also possible to install an irradiation coil and a receiver coil separately.

The transfer tube storage conduit 32 has a length of about 3 meters and a diameter of about 10 centimeters. As a result of optimizing the thickness and number of superinsulators, the amount of heat intrusion shown in Table 2 has been obtained.

TABLE 2

| Name | Coolant temperature at the inlet (K) | Amount of heat intrusion (W) |
| --- | --- | --- |
| 1st transfer tube | 4.5 | 0.15 |
| 2nd transfer tube | 5.1 | 0.15 |
| 3rd transfer tube | 58 | 11.5 |
| 4th transfer tube | 82 | 0.53 |

FIG. 1 shows the result of measuring the temperatures at various sections when the embodiment of the present invention is operated under the aforementioned conditions.

It shows the result of measuring the temperature when operation is performed under a coolant pressure of 1 MPa at the delivery port of the compressor 31 and 0.3 MPa immediately after the pressure control valve 30 at the coolant flow rate of 0.1 g/s. As can be seen from FIG. 1, the coil cooling heat exchanger 56 can be cooled down to about 5 K. This allows the preamplifier 50 to be cooled down to the cryogenic temperature level, and hence improves the value Q and signal-to-noise ratio.

Further, the temperature of 5 K is close to the 4.2 K, the temperature of liquid helium under the normal pressure. This temperature permits a stable use of the Y-123, Bi-2223 or Bi-2212 oxide-based superconductor as well as a metallic superconductor of $MgB_2$, $Nb_3Al$, $Nb_3Sn$, NbTi or the like as an irradiation coil and reception coil.

When a magnetic field is applied to the oxide superconductor in the direction vertical to the superconducting film, there is a problem of the transport current being reduced about two digits, as compared to the case where it is applied in the parallel direction. This means that there is a restriction imposed on the configuration of the irradiation coil and reception coil. In the meantime, such anisotropy is smaller in the case of the metallic superconductor, which provides the advantage of coils of complicated configuration being created easily.

The metallic superconductor generally has a low superconductivity transition temperature, and is characterized in that the critical current is reduced even at a temperature below the superconductivity transition level if the temperature is high. To produce the coil of complicated configuration in a simple manner, it is recommended to use the metallic superconductor and to minimize the temperature level.

The temperature of 5 K achieved in the present embodiment is sufficiently low to use a common metallic superconductor as a coil. Use of the present embodiment allows coils of complicated configuration to be manufactured. The following describes how the temperature can be reduced down to 5 K.

Structure of Transfer Tube Storage Conduit 32

In the present embodiment, a third transfer tube 38 of a double tubular form having a coolant temperature of about 58 through 80 K is provided in the transfer tube storage conduit 32. This tube incorporates thereinto a first transfer tube 34 having a coolant temperature of about 4.5 through 4.9 K, a second transfer tube 36 having a coolant temperature of about 5.1 through 5.4 K and a fourth transfer tube 40 having a coolant temperature of about 82 through 83 K. In such a structure, the third transfer tube 38 provides the functions of a radiation shield, thereby achieving a substantial reduction in the intrusion of heat by radiation into internal first transfer tube 34, second transfer tube 36 and fourth transfer tube 40.

In the present embodiment, a fourth transfer tube 40 is designed in a double tubular structure. Even if the third transfer tube 38 is arranged inside, almost the same effect can be achieved.

However, when each transfer tube is provided with cryogenic insulation using a superinsulator, there is a large amount of heat intrusion by radiation, and therefore it is difficult to supply the coolant on a 5 K level to the coil cooling heat exchanger 56. This makes it necessary to increase the number of and a thickness of the superinsulators, with the result that the transfer tube cannot be designed in a compact configuration.

When two transfer tube storage conduits 32 are used, first transfer tube 34 and second transfer tube 36 are stored in one of the transfer tube storage conduits, and, third transfer tube 38 and fourth transfer tube 40 are stored in the other transfer tube storage conduit. However, it is also difficult to supply the coolant on the 5 K level for the same reason.

The cooling performance of the first cooling stage 12 of the cryo-cooler 10 is about 25 watts at a temperature of 40 K, and that of the second cooling stage 14 is about 1.5 watts at a temperature of 4.5 K. As is clear from the above, the cooling performances of the first cooling stage 12 is higher than that of the second cooling stage 14. Thus, when the radiation heat or the like is to be cooled by the cryo-cooler 10, it is preferred in principle that the third transfer tube 38 be used as a radiation shield so that the cooling performance of the first cooling stage 12 can be effectively utilized.

Position of Pressure Control Valve 30

In the present embodiment, the pressure control valve 30 is adjusted to the room temperature environment. It has already been described that coolant pressure must be dropped by the pressure control valve 30. The pressure control valve 30 can be placed at any desired position. However, when the pressure control valve 30 is to be placed at the position where the coolant is at a cryogenic level, it is necessary to use a low-temperature value permitting the open/close operation of the valve at a low temperature.

The valve body of a low-temperature valve has a cryogenic temperature, but its operation handle has a normal temperature; therefore, the length of the rotary rod communicating between the valve and operation handle is reduced to minimize the amount of heat intrusion due to heat conduction. However, if coolant pressure is high, the rotary rod must have a greater size in order to avoid the possibility of damage due to pressure. For example, the amount of heat intrusion of the low-temperature valve that can be used at a coolant temperature of 5 K under a pressure of 1 MPa is several watts.

If the low-temperature valve of such a configuration is used, there is a problem of coolant temperature being raised. In the present embodiment, a pressure control valve 30 is arranged at the portion of the normal temperature, thereby allowing the coolant temperature to be reduced to about 5 K.

In the meantime, it is possible to use a low-temperature valve to reduce the pressure of the cryogenic coolant and to utilize the Joule-Thomson effect is to reduce the coolant temperature and liquefy the coolant. In this case, the effect can be gained by installing the pressure control valve 30 between the second stage heat exchanger 20 and first transfer tube 34, as indicated by a dotted line.

Figure 11:
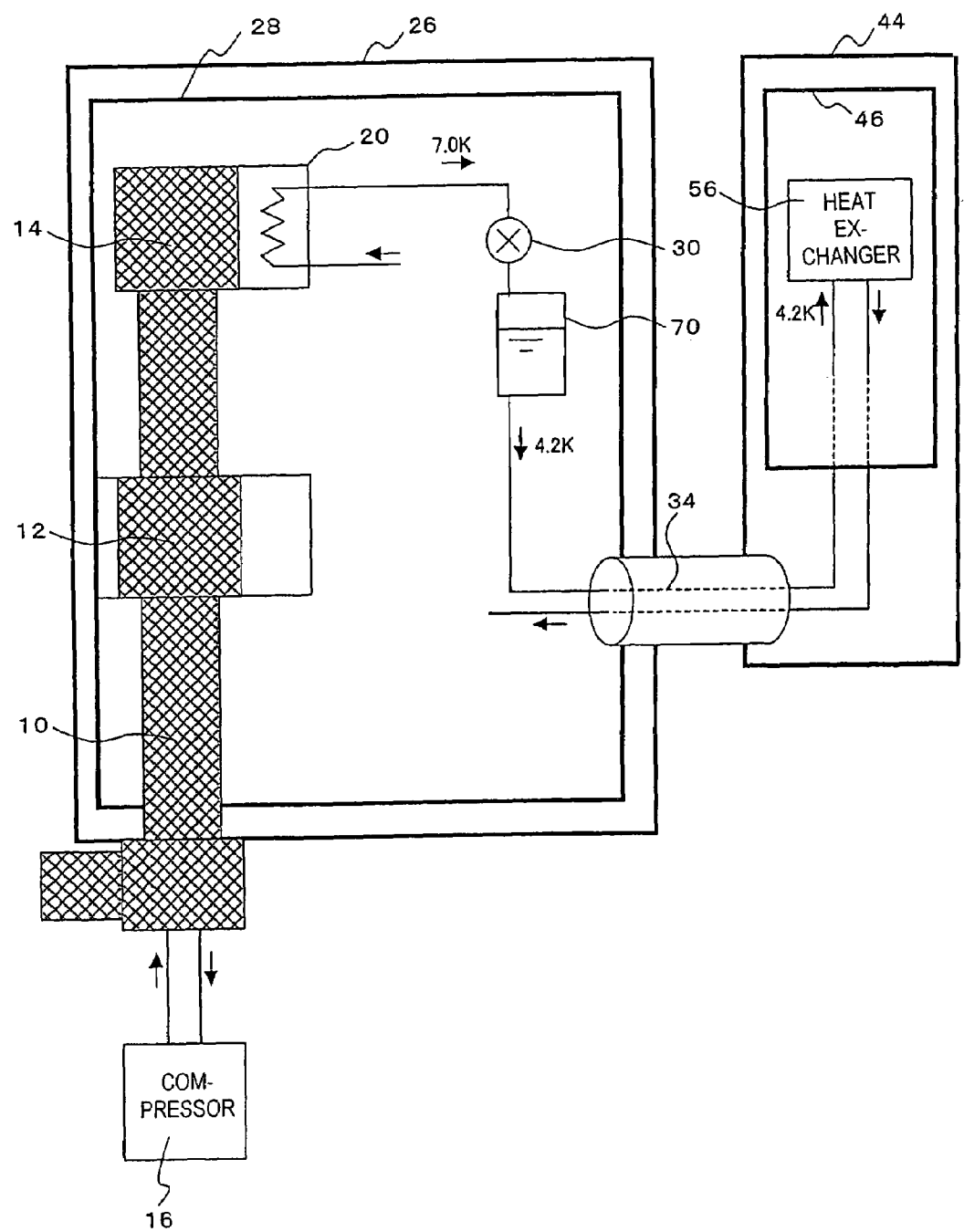
FIG. 11 is a drawing representing the positions of a low-temperature valve and coolant tank installed in the first embodiment.

FIG. 11 shows the detailed configuration. Only the pressure control valve 30, coolant tank 70, second stage heat exchanger 20, first transfer tube 34 and coil cooling heat exchanger 56 are shown in FIG. 11, and other components are not illustrated. Another pressure control valve can be installed on the portion of normal temperature at the inlet of the compressor 31 as shown in FIG. 1, in addition to the positions illustrated in FIG. 11.

To get the Joule-Thomson effect in an efficient manner, for example, when helium is used as a coolant, the coolant should enter the pressure control valve 30 at a temperature of 7 K under a pressure of 1 MPa, and the coolant should be discharged from the pressure control valve 30 under a pressure of about 0.1 MPa. Under these conditions, it is possible to get the liquid helium having a temperature of 4.2 K.

The helium obtained in this manner is stored in the coolant tank 70 and a required amount is transferred to the coil cooling heat exchanger 56, thereby allowing the preamplifier 50 to be cooled down to 4.2 K, with the result that the value Q and signal-to-noise ratio are further improved.

Figure 3:
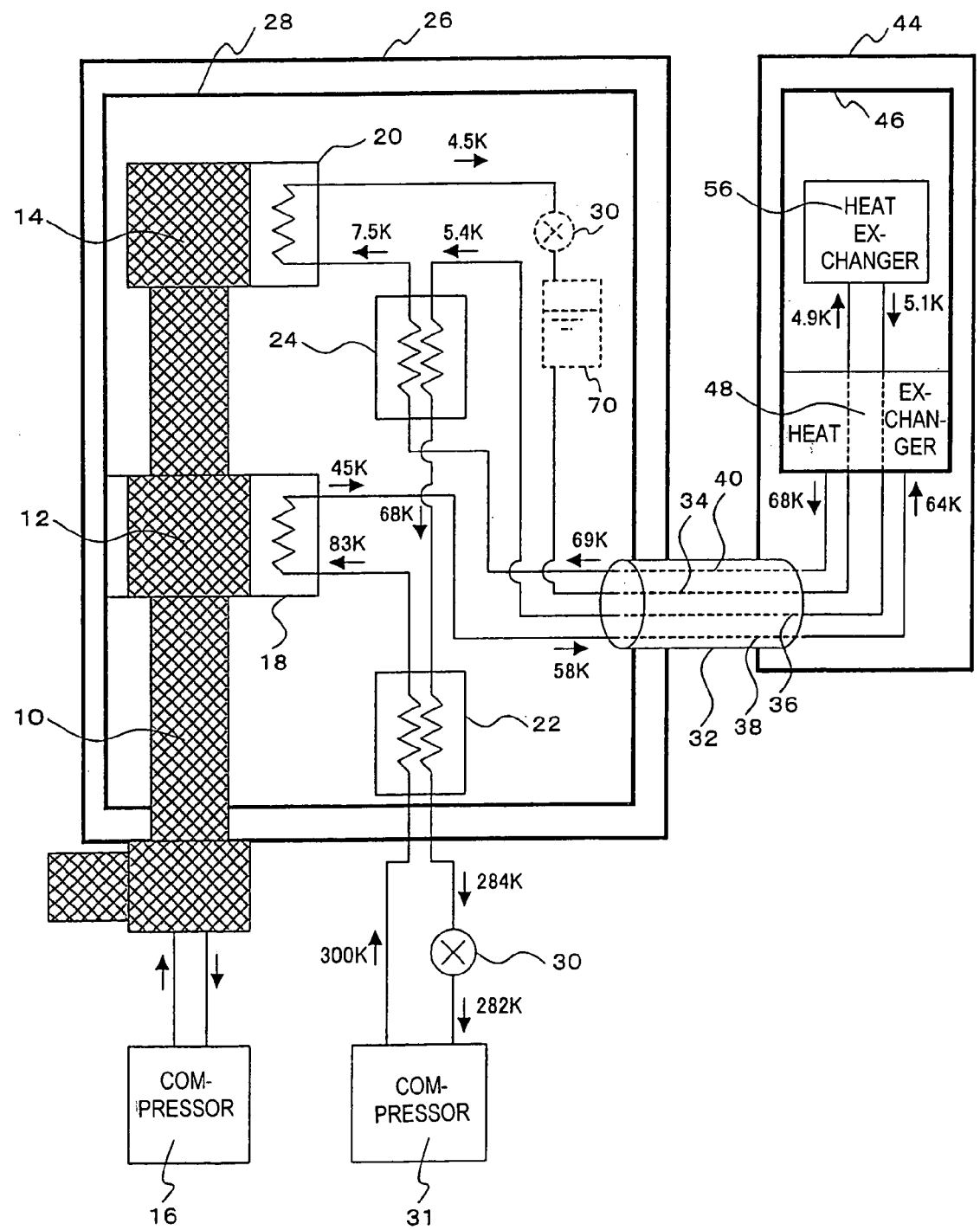
FIG. 3 is a drawing representing a second embodiment.

FIG. 3 is a drawing representing another embodiment of the present invention.

The compressor 31 permits the coolant to circulate through the path consisting of the first counter-flow heat exchanger 22, first stage heat exchanger 18, third transfer tube 38, preamplifier heat exchanger 48, fourth transfer tube 40, second counter-flow heat exchanger 24, second stage heat exchanger 20, first transfer tube 34, coil cooling heat exchanger 56, second transfer tube 36 and second counter-flow heat exchanger 24 and first counter-flow heat exchanger 22, in that order. The cryo-cooler 10 is driven by the cryo-cooler compressor 16. The first cooling stage 12 is thermally connected with the first stage heat exchanger 18, and second cooling stage 14 with the second stage heat exchanger 20.

The first stage heat exchanger 18 can cool the coolant down to 45 K, and the second stage heat exchanger 20 to 4.5 K. The first counter-flow heat exchanger 22, first stage heat exchanger 18, second counter-flow heat exchanger 24 and second stage heat exchanger 20 are installed inside the radiation shield 28 located in the vacuum container 26.

The radiation shield 28 is thermally connected with the first cooling stage 12 of the cryo-cooler 10. A vacuum is created inside the vacuum container 26. A superinsulator as a multi-heat insulating layer is wound outside the radiation shield 28, thereby reducing the radiation heat applied to the equipment inside the radiation shield 28.

The pressure control valve 30 has the coolant located at the inlet of the compressor 31 at a room temperature, and can be adjusted to a desired opening angle in the range from 0 to 100%. The structure and thermal characteristics of the transfer tube storage conduit 32 and its interior are the same as those described with reference to FIG. 2 and Table 2.

FIG. 3 shows the result of measuring the temperature of each section when the present embodiment is operated.

It shows the result of measuring the temperature when operation is performed under a coolant pressure of 1 MPa at the delivery port of the compressor 31 and 0.3 MPa immediately after the pressure control valve 30 at the coolant flow rate of 0.1 g/s. As can be seen from FIG. 3, the coil cooling heat exchanger 56 can be cooled down to about 5 K.

This allows the preamplifier 50 to be cooled down to the cryogenic temperature level, and hence improves the value Q and signal-to-noise ratio. Further, the temperature of 5 K is close to the 4.2 K, the temperature of liquid helium under the normal pressure. This temperature permits a stable use of the Y-123, Bi-2223 or Bi-2212 oxide-based superconductor as well as a metallic superconductor of MgB2, Nb3Al, Nb3Sn, NbTi or the like as an irradiation coil and reception coil.

When a magnetic field is applied to the oxide superconductor in the direction vertical to the superconducting film, there is a problem of the transport current being reduced about two digits, as compared to the case where it is applied in the parallel direction. This means that there is a restriction imposed on the configuration of the irradiation coil and reception coil.

In the meantime, such anisotropy is smaller in the case of the metallic superconductor, which provides the advantage of coils of complicated configuration being created easily. However, the metallic superconductor generally has a low superconductivity transition temperature, and is characterized in that the critical current is reduced even at a temperature below the superconductivity transition level if the temperature is high.

To produce the coil of complicated configuration in a simple manner, it is recommended to use the metallic superconductor and to minimize the temperature level. The temperature of 5 K achieved in the present embodiment is sufficiently low to use a common metallic superconductor as a coil. Use of the present embodiment allows coils of complicated configuration to be manufactured.

As described with reference to FIG. 1, it is possible to use a low-temperature valve to reduce the pressure of the cryogenic coolant and to utilize the Joule-Thomson effect is to reduce the coolant temperature further and liquefy the coolant. In this case, the effect can be gained by installing the pressure control valve 30 between the second stage heat exchanger 20 and first transfer tube 34.

To get the Joule-Thomson effect in an efficient manner, for example, when helium is used as a coolant, the coolant should enter the pressure control valve 30 at a temperature of 7 K under a pressure of 1 MPa, and the coolant should be discharged from the pressure control valve 30 under a pressure of about 0.1 MPa. Under these conditions, it is possible to get the liquid helium having a temperature of 4.2 K.

The helium obtained in this manner is stored in the coolant tank 70 and a required amount is transferred to the coil cooling heat exchanger 56, thereby allowing the preamplifier 50 to be cooled down to 4.2 K, with the result that the value Q and signal-to-noise ratio are further improved.

Figure 4:
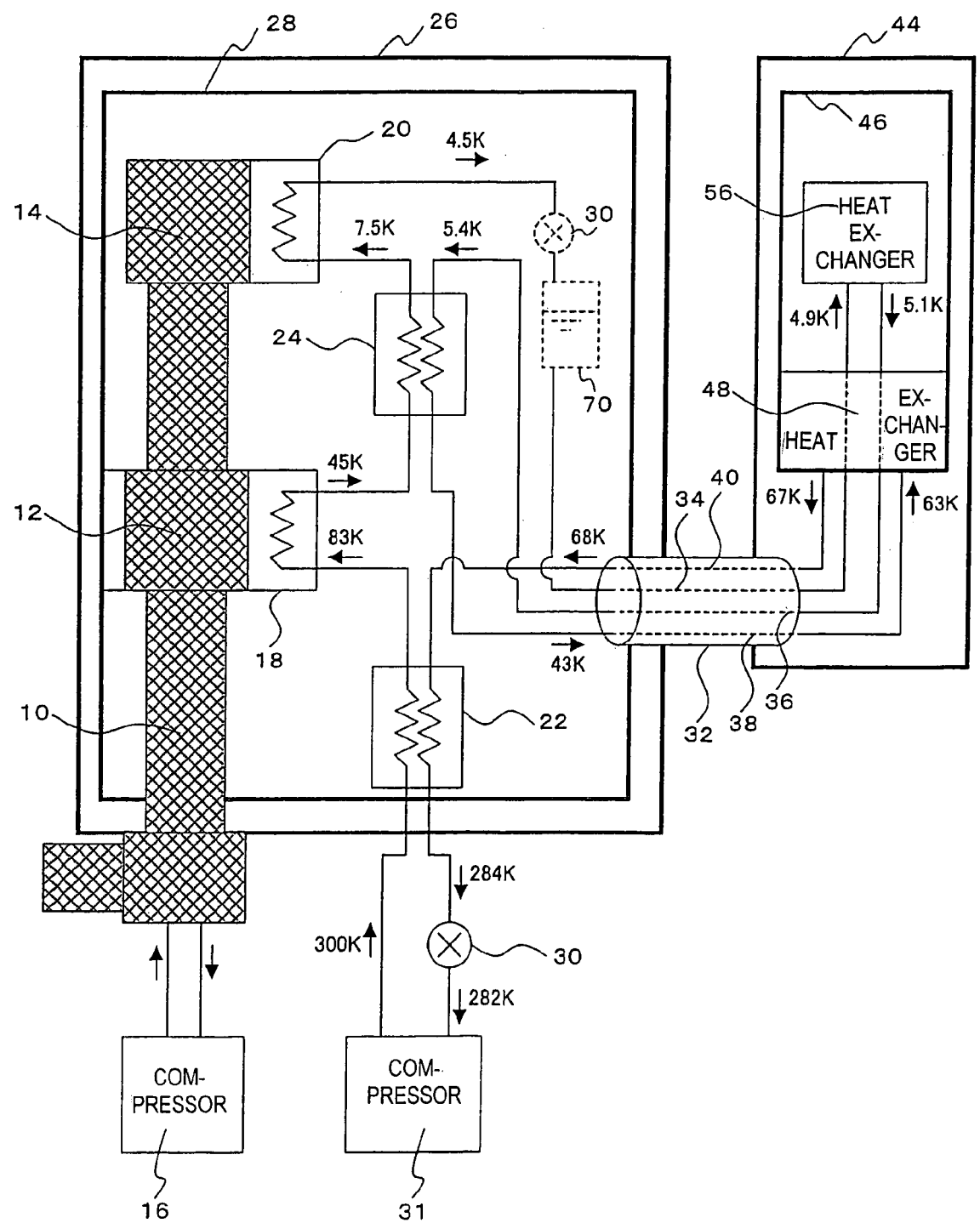
FIG. 4 is a drawing representing a third embodiment.

FIG. 4 is a drawing representing another embodiment of the present invention.

The compressor 31 permits the coolant to circulate through the path consisting of the first counter-flow heat exchanger 22, first stage heat exchanger 18, second counter-flow heat exchanger 24, second stage heat exchanger 20, first transfer tube 34, coil cooling heat exchanger 56, second transfer tube 36, second counter-flow heat exchanger 24, third transfer tube 38, preamplifier heat exchanger 48, fourth transfer tube 40 and first counter-flow heat exchanger 22 in that order.

The cryo-cooler 10 is driven by the cryo-cooler compressor 16. The first cooling stage 12 is thermally connected with the first stage heat exchanger 18, and second cooling stage with the second stage heat exchanger 20. The first stage heat exchanger 18 can cool the coolant down to 45 K, and the second stage heat exchanger 20 to 4.5 K.

The first counter-flow heat exchanger 22, first stage heat exchanger 18, second counter-flow heat exchanger 24 and second stage heat exchanger 20 are installed inside the radiation shield 28 located in the vacuum container 26. The radiation shield 28 is thermally connected with the first cooling stage 12 of the cryo-cooler 10.

A vacuum is created inside the vacuum container 26. A superinsulator as a multi-heat insulating layer is wound outside the radiation shield 28, thereby reducing the radiation heat applied to the equipment inside the radiation shield 28.

The pressure control valve 30 has the coolant located at the inlet of the compressor 31 at a room temperature, and can be adjusted to a desired opening angle in the range from 0 to 100%. The structure and thermal characteristics of the transfer tube storage conduit 32 and its interior are the same as those described with reference to FIG. 2 and Table 2.

FIG. 4 shows the result of measuring the temperature of each section when the present embodiment is operated.

It shows the result of measuring the temperature when operation is performed under a coolant pressure of 1 MPa at the delivery port of the compressor 31 and 0.3 MPa immediately after the pressure control valve 30 at the coolant flow rate of 0.1 g/s.

As can be seen from FIG. 4, the coil cooling heat exchanger 56 can be cooled down to about 5 K. This allows the preamplifier 50 to be cooled down to the cryogenic temperature level, and hence improves the value Q and signal-to-noise ratio.

Further, the temperature of 5 K is close to the 4.2 K, the temperature of liquid helium under the normal pressure. This temperature permits a stable use of the Y-123, Bi-2223 or Bi-2212 oxide-based superconductor as well as a metallic superconductor of MgB2, Nb3Al, Nb3Sn, NbTi or the like as an irradiation coil and reception coil.

When a magnetic field is applied to the oxide superconductor in the direction vertical to the superconducting film, there is a problem of the transport current being reduced about two digits, as compared to the case where it is applied in the parallel direction. This means that there is a restriction imposed on the configuration of the irradiation coil and reception coil. In the meantime, such anisotropy is smaller in the case of the metallic superconductor, which provides the advantage of coils of complicated configuration being created easily.

However, the metallic superconductor generally has a low superconductivity transition temperature, and is characterized in that the critical current is reduced even at a temperature below the superconductivity transition level if the temperature is high. Accordingly, to produce the coil of complicated configuration in a simple manner, it is recommended to use the metallic superconductor and to minimize the temperature level.

The temperature of 5 K achieved in the present embodiment is sufficiently low to use a common metallic superconductor as a coil. Use of the present embodiment allows coils of complicated configuration to be manufactured.

As described with reference to FIG. 1, it is possible to use a low-temperature valve to reduce the pressure of the cryogenic coolant and to utilize the Joule-Thomson effect is to reduce the coolant temperature further and liquefy the coolant. In this case, the effect can be gained by installing the pressure control valve 30 between the second stage heat exchanger 20 and first transfer tube 34.

To get the Joule-Thomson effect in an efficient manner, for example, when helium is used as a coolant, the coolant should enter the pressure control valve 30 at a temperature of 7 K under a pressure of 1 MPa, and the coolant should be discharged from the pressure control valve 30 under a pressure of about 0.1 MPa. Under these conditions, it is possible to get the liquid helium having a temperature of 4.2 K.

The helium obtained in this manner is stored in the coolant tank 70 and a required amount is transferred to the coil cooling heat exchanger 56, thereby allowing the preamplifier 50 to be cooled down to 4.2 K, with the result that the value Q and signal-to-noise ratio are further improved.

Figure 5:
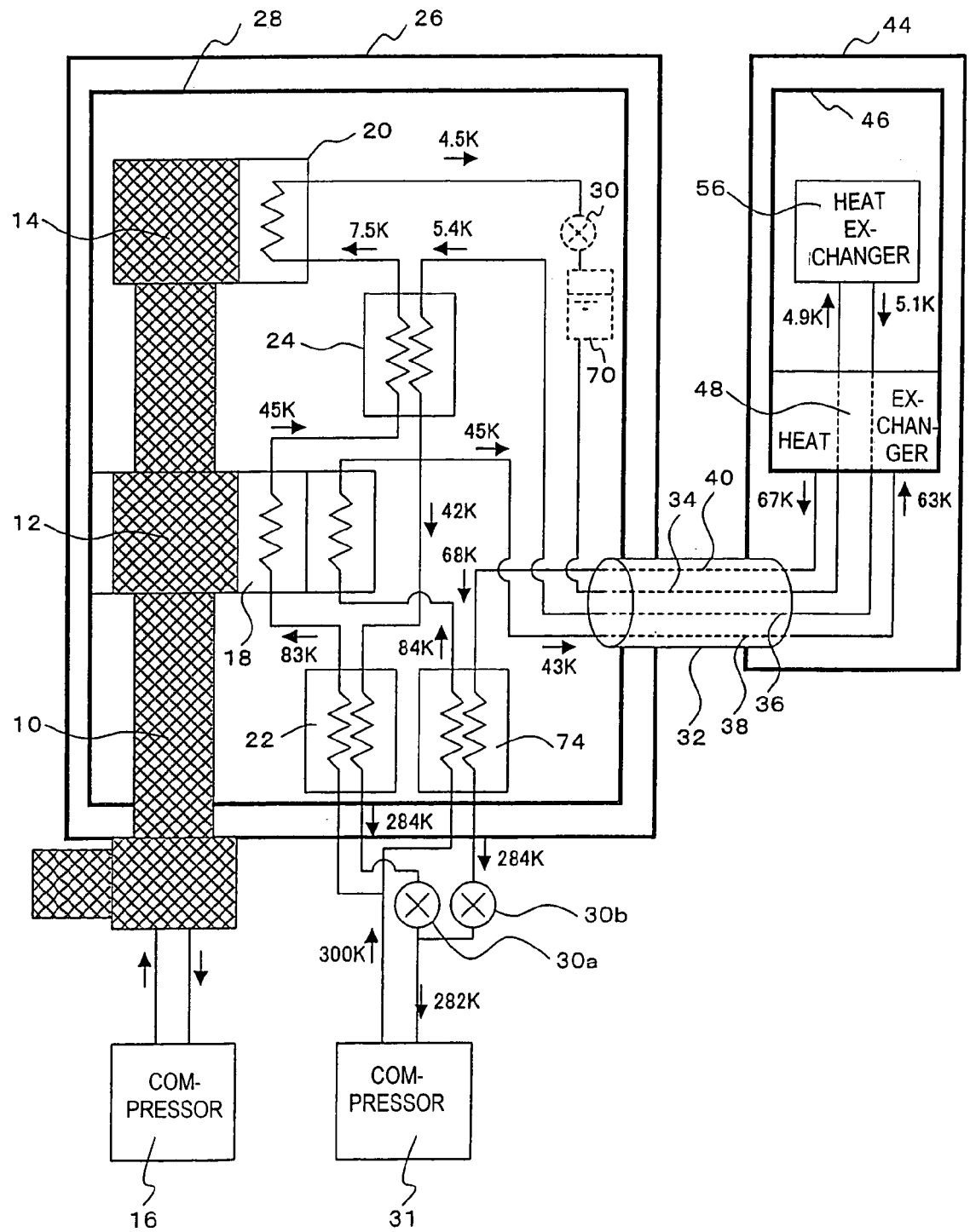
FIG. 5 is a drawing representing a fourth embodiment.

FIG. 5 is a drawing representing a further embodiment of the present invention. The compressor 31 permits the coolant to circulate through the first path consisting of the first counter-flow heat exchanger 22, first stage heat exchanger 18, second counter-flow heat exchanger 24, second stage heat exchanger 20, first transfer tube 34, coil cooling heat exchanger 56 and first counter-flow heat exchanger 22 in that order.

The coolant circulates through the second path branching off from the first path at the coolant branching point provided between the compressor 31 and first counter-flow heat exchanger 22 in the first path, where the aforementioned second path consists of the packet matching unit 74, first stage heat exchanger 18, third transfer tube 38, preamplifier heat exchanger 48, fourth transfer tube 40 and packet matching unit 74, according to whose order the coolant circulates.

The cryo-cooler 10 is driven by the cryo-cooler compressor 16. The first cooling stage 12 is thermally connected with the first stage heat exchanger 18, and second cooling stage with the second stage heat exchanger 20. The first stage heat exchanger 18 can cool the coolant down to 45 K, and the second stage heat exchanger 20 to 4.5 K.

The first counter-flow heat exchanger 22, first stage heat exchanger 18, second counter-flow heat exchanger 24 and second stage heat exchanger 20 are installed inside the radiation shield 28 located in the vacuum container 26. The radiation shield 28 is thermally connected with the first cooling stage 12 of the cryo-cooler 10. A vacuum is created inside the vacuum container 26. A superinsulator as a multi-heat insulating layer is wound outside the radiation shield 28, thereby reducing the radiation heat applied to the equipment inside the radiation shield 28.

The pressure control valves 30a and 30b have the coolant located at the inlet of the compressor 31 at a room temperature, and can be adjusted to a desired opening angle in the range from 0 to 100%. The structure and thermal characteristics of the transfer tube storage conduit 32 and its interior are the same as those described with reference to FIG. 2 and Table 2.

FIG. 5 shows the result of measuring the temperature of each section when the present embodiment is operated.

It shows the result of measuring the temperature when operation is performed under a coolant pressure of 1 MPa at the delivery port of the compressor 31 and 0.3 MPa immediately after the pressure control valve 30 at the coolant flow rate of 0.1 g/s.

As can be seen from FIG. 5, the coil cooling heat exchanger 56 can be cooled down to about 5 K. This allows the preamplifier 50 to be cooled down to the cryogenic temperature level, and hence improves the value Q and signal-to-noise ratio.

Further, the temperature of 5 K is close to the 4.2 K, the temperature of liquid helium under the normal pressure. This temperature permits a stable use of the Y-123, Bi-2223 or Bi-2212 oxide-based superconductor as well as a metallic superconductor of $MgB_2$, $Nb_3Al$, $Nb_3Sn$, NbTi or the like as an irradiation coil and reception coil.

When a magnetic field is applied to the oxide superconductor in the direction vertical to the superconducting film, there is a problem of the transport current being reduced about two digits, as compared to the case where it is applied in the parallel direction. This means that there is a restriction imposed on the configuration of the irradiation coil and reception coil.

In the meantime, such anisotropy is smaller in the case of the metallic superconductor, which provides the advantage of coils of complicated configuration being created easily. However, the metallic superconductor generally has a low superconductivity transition temperature, and is characterized in that the critical current is reduced even at a temperature below the superconductivity transition level if the temperature is high.

To produce the coil of complicated configuration in a simple manner, it is recommended to use the metallic superconductor and to minimize the temperature level. The temperature of 5 K achieved in the present embodiment is sufficiently low to use a common metallic superconductor as a coil. Use of the present embodiment allows coils of complicated configuration to be manufactured.

As described with reference to FIG. 1, it is possible to use a low-temperature valve to reduce the pressure of the cryogenic coolant and to utilize the Joule-Thomson effect is to reduce the coolant temperature further and liquefy the coolant. In this case, the effect can be gained by installing the pressure control valve 30 between the second stage heat exchanger 20 and first transfer tube 34.

To get the Joule-Thomson effect in an efficient manner, for example, when helium is used as a coolant, the coolant should enter the pressure control valve 30 at a temperature of 7 K under a pressure of 1 MPa, and the coolant should be discharged from the pressure control valve 30 under a pressure of about 0.1 MPa. Under these conditions, it is possible to get the liquid helium having a temperature of 4.2 K.

The helium obtained in this manner is stored in the coolant tank 70 and a required amount is transferred to the coil cooling heat exchanger 56, thereby allowing the preamplifier 50 to be cooled down to 4.2 K, with the result that the value Q and signal-to-noise ratio are further improved.

Figure 6:
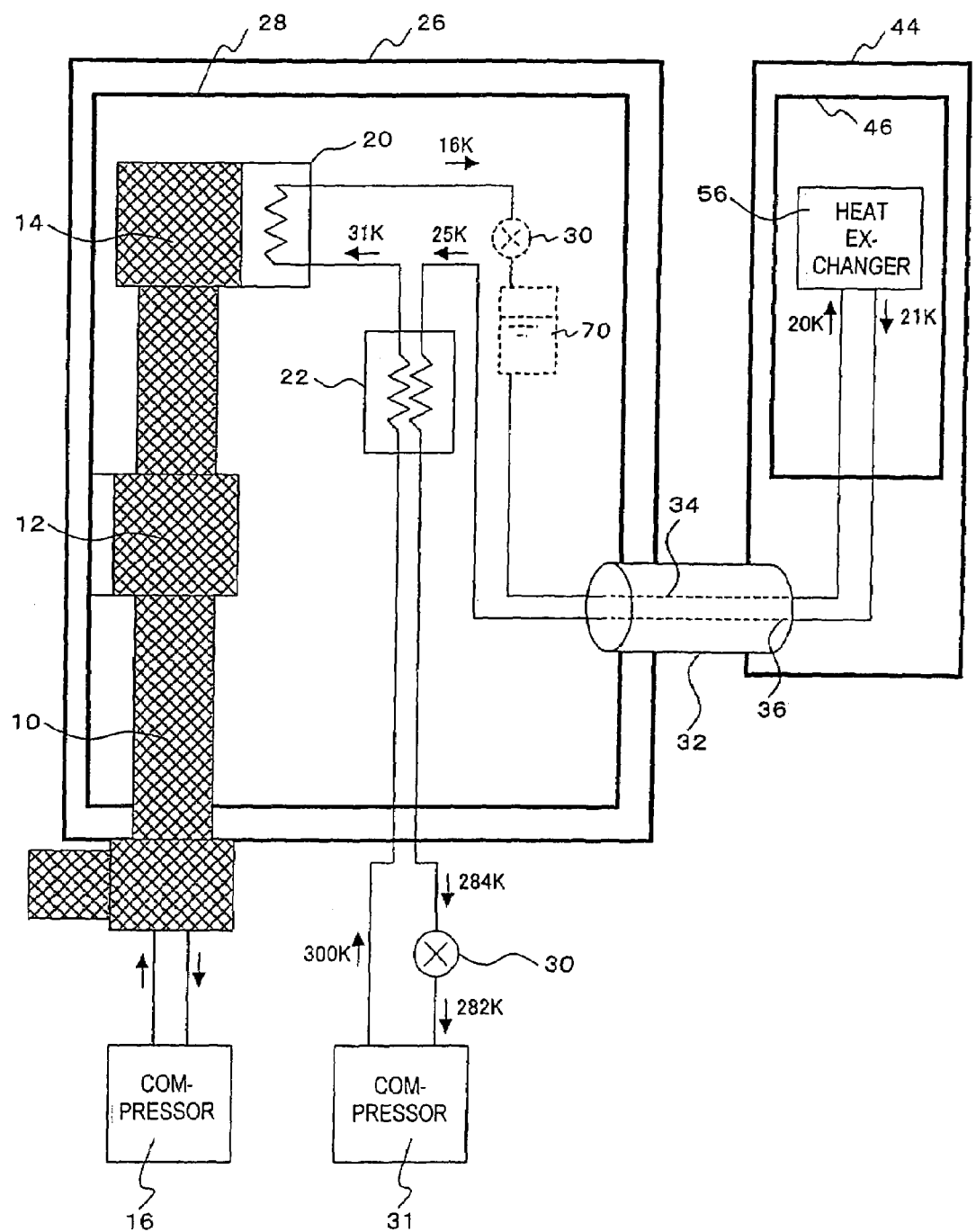
FIG. 6 is a drawing representing a fifth embodiment.

FIG. 6 is a drawing representing a still further embodiment of the present invention. The compressor 31 permits the coolant to circulate through the path consisting of the first counter-flow heat exchanger 22, second stage heat exchanger 20, first transfer tube 34, coil cooling heat exchanger 56, second transfer tube 36 and first counter-flow heat exchanger 22 in that order.

The cryo-cooler 10 is driven by the cryo-cooler compressor 16. The second cooling stage is thermally connected with the second stage heat exchanger 20. The second stage heat exchanger 20 can cool the coolant down to 4.5 K. The first counter-flow heat exchanger 22 and second stage heat exchanger 20 are installed inside the radiation shield 28 located in the vacuum container 26. The radiation shield 28 is thermally connected with the first cooling stage 12.

A vacuum is created inside the vacuum container 26. A superinsulator as a multi-heat insulating layer is wound outside the radiation shield 28, thereby reducing the radiation heat applied to the equipment inside the radiation shield 28. The pressure control valve 30 has the coolant located at the inlet of the compressor 31 at a room temperature, and can be adjusted to a desired opening angle in the range from 0 to 100%. The structure and thermal characteristics of the transfer tube storage conduit 32 and its interior are the same as those described with reference to FIG. 2 and Table 2. However, in the present embodiment, there is no third transfer tube 38 or fourth transfer tube.

FIG. 6 shows the result of measuring the temperature of each section when the present embodiment is operated.

It shows the result of measuring the temperature when operation is performed under a coolant pressure of 1 MPa at the delivery port of the compressor 31 and 0.3 MPa immediately after the pressure control valve 30 at the coolant flow rate of 0.1 g/s. As can be seen from FIG. 6, the coil cooling heat exchanger 56 can be cooled down to about 5 K. This allows the preamplifier 50 to be cooled down to about 20 K.

As described with reference to FIG. 1, it is possible to use a low-temperature valve to reduce the pressure of the cryogenic coolant and to utilize the Joule-Thomson effect is to reduce the coolant temperature further. In this case, the effect can be gained by installing the pressure control valve 30 between the second stage heat exchanger 20 and first transfer tube 34.

The helium is stored in the coolant tank 70 and a required amount is transferred to the coil cooling heat exchanger 56, thereby allowing the preamplifier 50 to be cooled further, with the result that the value Q and signal-to-noise ratio are further improved.

Figure 7:
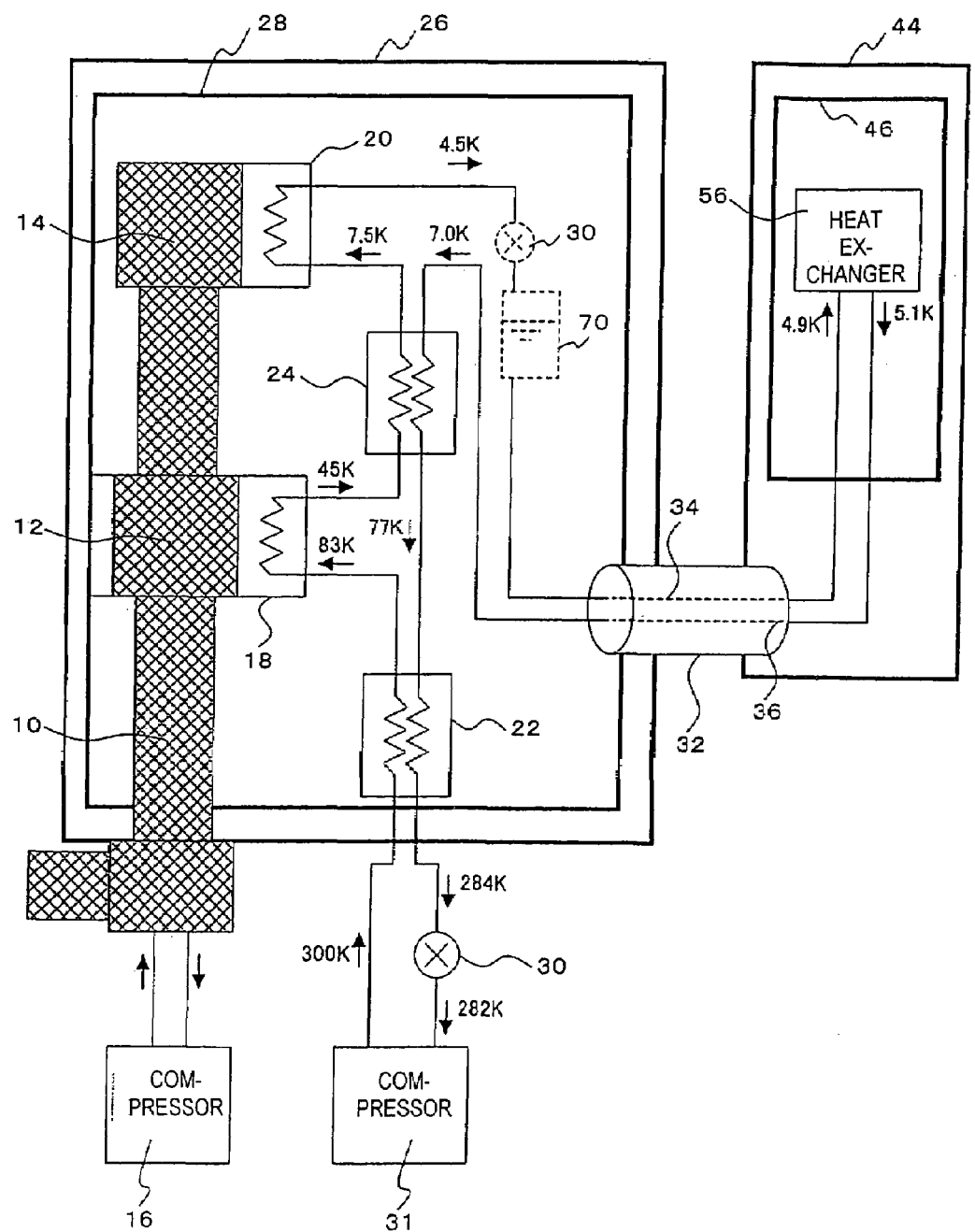
FIG. 7 is a drawing representing a sixth embodiment.

FIG. 7 is a drawing representing a still further embodiment of the present invention.

The compressor 31 permits the coolant to circulate through the path consisting of the first counter-flow heat exchanger 22, first stage heat exchanger 18, second counter-flow heat exchanger 24, second stage heat exchanger 20, first transfer tube 34, coil cooling heat exchanger 56, second transfer tube 36, second counter-flow heat exchanger 24 and first counter-flow heat exchanger 22 in that order.

The cryo-cooler 10 is driven by the cryo-cooler compressor 16. The first cooling stage 12 is thermally connected with the first stage heat exchanger 18, and the second cooling stage 14 with the second stage heat exchanger 20. The first stage heat exchanger 18 can cool the coolant down to 45 K, and the second stage heat exchanger 20 to 4.5 K.

The first counter-flow heat exchanger 22, first stage heat exchanger 18, second counter-flow heat exchanger 24 and second stage heat exchanger 20 are installed inside the radiation shield 28 located in the vacuum container 26. The radiation shield 28 is thermally connected with the first cooling stage 12 of the cryo-cooler 10. A vacuum is created inside the vacuum container 26. A superinsulator as a multi-heat insulating layer is wound outside the radiation shield 28, thereby reducing the radiation heat applied to the equipment inside the radiation shield 28.

The pressure control valve 30 has the coolant located at the inlet of the compressor 31 at a room temperature, and can be adjusted to a desired opening angle in the range from 0 to 100%. The structure and thermal characteristics of the transfer tube storage conduit 32 and its interior are the same as those described with reference to FIG. 2 and Table 2. However, in the present embodiment, there is no third transfer tube 38 or fourth transfer tube.

FIG. 7 shows the result of measuring the temperature of each section when the present embodiment is operated.

It shows the result of measuring the temperature when operation is performed under a coolant pressure of 1 MPa at the delivery port of the compressor 31 and 0.3 MPa immediately after the pressure control valve 30 at the coolant flow rate of 0.1 g/s.

As can be seen from FIG. 7, the coil cooling heat exchanger 56 can be cooled down to about 5 K. This allows the preamplifier 50 to be cooled down to the cryogenic temperature level, and hence improves the value Q and signal-to-noise ratio.

Further, the temperature of 5 K is close to the 4.2 K, the temperature of liquid helium under the normal pressure. This temperature permits a stable use of the Y-123, Bi-2223 or Bi-2212 oxide-based superconductor as well as a metallic superconductor of $MgB_2$, $Nb_3Al$, $Nb_3Sn$, NbTi or the like as an irradiation coil and reception coil.

When a magnetic field is applied to the oxide superconductor in the direction vertical to the superconducting film, there is a problem of the transport current being reduced about two digits, as compared to the case where it is applied in the parallel direction. This means that there is a restriction imposed on the configuration of the irradiation coil and reception coil. In the meantime, such anisotropy is smaller in the case of the metallic superconductor, which provides the advantage of coils of complicated configuration being created easily.

However, the metallic superconductor generally has a low superconductivity transition temperature, and is characterized in that the critical current is reduced even at a temperature below the superconductivity transition level if the temperature is high. Thus, to produce the coil of complicated configuration in a simple manner, it is recommended to use the metallic superconductor and to minimize the temperature level.

The temperature of 5 K achieved in the present embodiment is sufficiently low to use a common metallic superconductor as a coil. Use of the present embodiment allows coils of complicated configuration to be manufactured.

As described with reference to FIG. 1, it is possible to use a low-temperature valve to reduce the pressure of the cryogenic coolant and to utilize the Joule-Thomson effect is to reduce the coolant temperature further and liquefy the coolant. In this case, the effect can be gained by installing the pressure control valve 30 between the second stage heat exchanger 20 and first transfer tube 34.

To get the Joule-Thomson effect in an efficient manner, for example, when helium is used as a coolant, the coolant should enter the pressure control valve 30 at a temperature of 7 K under a pressure of 1 MPa, and the coolant should be discharged from the pressure control valve 30 under a pressure of about 0.1 MPa.

Under these conditions, it is possible to get the liquid helium having a temperature of 4.2 K. The helium obtained in this manner is stored in the coolant tank 70 and a required amount is transferred to the coil cooling heat exchanger 56, thereby allowing the preamplifier 50 to be cooled down to 4.2 K, with the result that the value Q and signal-to-noise ratio are further improved.

Figure 8:
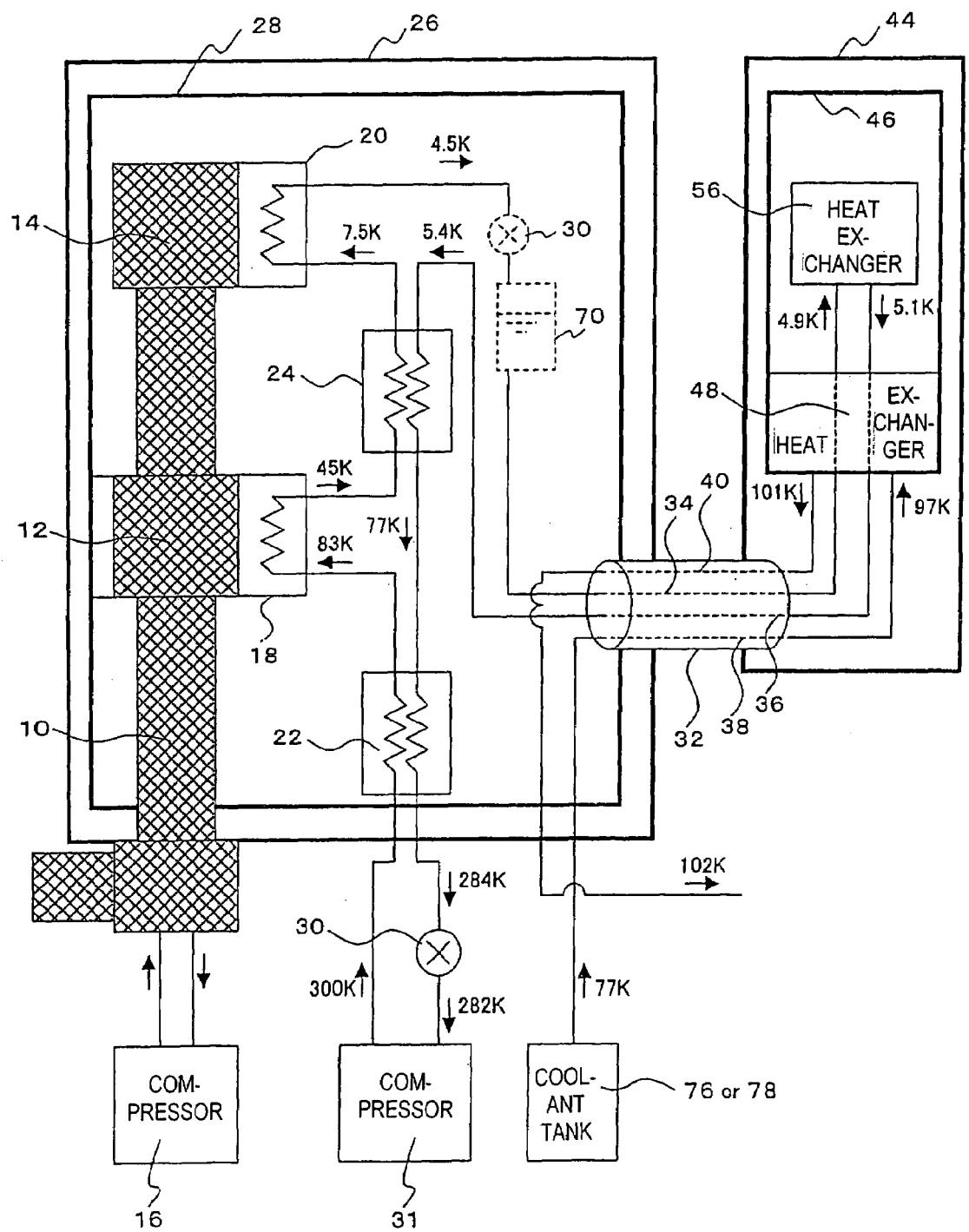
FIG. 8 is a drawing representing a seventh embodiment.

FIG. 8 is a drawing representing a still further embodiment of the present invention. The compressor 31 permits the coolant to circulate through the path consisting of the first counter-flow heat exchanger 22, first stage heat exchanger 18, second counter-flow heat exchanger 24, second stage heat exchanger 20, first transfer tube 34, coil cooling heat exchanger 56, second transfer tube 36, second counter-flow heat exchanger 24 and first counter-flow heat exchanger 22 in that order.

Further, a second coolant tank 76 is provided, and heat exchange is carried out between the coolant, preferably liquid nitrogen, nitrogen gas or helium gas cooled down to 100 K or less, having been stored in the second coolant tank 76 through the preamplifier heat exchanger 48, and the preamplifier 50. FIG. 8 shows the temperature when liquid nitrogen is used as coolant. A preamplifier cooling device 78 can be installed instead of the second coolant tank 76.

The preamplifier cooling device 78 is provided with a second cooler different from the cryo-cooler is installed in other than the aforementioned path, and heat exchange is performed between the coolant cooled by said second cooler and said preamplifier through a preamplifier heat exchanger. Use of nitrogen gas cooled down to 100 K or less is preferred as the coolant in this case. FIG. 8 shows the temperature of nitrogen gas.

The cryo-cooler 10 is driven by the cryo-cooler compressor 16. The first cooling stage 12 is thermally connected with the first stage heat exchanger 18, and the second cooling stage with the second stage heat exchanger 20. The first stage heat exchanger 18 can cool the coolant down to 45 K, and the second stage heat exchanger 20 to 4.5 K.

The first counter-flow heat exchanger 22, first stage heat exchanger 18, second counter-flow heat exchanger 24 and second stage heat exchanger 20 are installed inside the radiation shield 28 located in the vacuum container 26. The radiation shield 28 is thermally connected with the first cooling stage 12 of the cryo-cooler 10. A vacuum is created inside the vacuum container 26. A superinsulator as a multi-heat insulating layer is wound outside the radiation shield 28, thereby reducing the radiation heat applied to the equipment inside the radiation shield 28.

The pressure control valve 30 has the coolant located at the inlet of the compressor 31 at a room temperature, and can be adjusted to a desired opening angle in the range from 0 to 100%. The structure and thermal characteristics of the transfer tube storage conduit 32 and its interior are the same as those described with reference to FIG. 2 and Table 2. However, in the present embodiment, there is no third transfer tube 38 or fourth transfer tube 40.

FIG. 7 shows the result of measuring the temperature of each section when the present embodiment is operated. It shows the result of measuring the temperature when operation is performed under a coolant pressure of 1 MPa at the delivery port of the compressor 31 and 0.3 MPa immediately after the pressure control valve 30 at the coolant flow rate of 0.1 g/s.

As can be seen from FIG. 8, the coil cooling heat exchanger 56 can be cooled down to about 5 K. This allows the preamplifier 50 to be cooled down to the cryogenic temperature level, and hence improves the value Q and signal-to-noise ratio.

Further, the temperature of 5 K is close to the 4.2 K, the temperature of liquid helium under the normal pressure. This temperature permits a stable use of the Y-123, Bi-2223 or Bi-2212 oxide-based superconductor as well as a metallic superconductor of $MgB_2$, $Nb_3Al$, $Nb_3Sn$, NbTi or the like as an irradiation coil and reception coil.

When a magnetic field is applied to the oxide superconductor in the direction vertical to the superconducting film, there is a problem of the transport current being reduced about two digits, as compared to the case where it is applied in the parallel direction. This means that there is a restriction imposed on the configuration of the irradiation coil and reception coil.

In the meantime, such anisotropy is smaller in the case of the metallic superconductor, which provides the advantage of coils of complicated configuration being created easily.

However, the metallic superconductor generally has a low superconductivity transition temperature, and is characterized in that the critical current is reduced even at a temperature below the superconductivity transition level if the temperature is high. Thus, to produce the coil of complicated configuration in a simple manner, it is recommended to use the metallic superconductor and to minimize the temperature level.

The temperature of 5 K achieved in the present embodiment is sufficiently low to use a common metallic superconductor as a coil. Use of the present embodiment allows coils of complicated configuration to be manufactured.

As described with reference to FIG. 1, it is possible to use a low-temperature valve to reduce the pressure of the cryogenic coolant and to utilize the Joule-Thomson effect is to reduce the coolant temperature further and liquefy the coolant. In this case, the effect can be gained by installing the pressure control valve 30 between the second stage heat exchanger 20 and first transfer tube 34.

To get the Joule-Thomson effect in an efficient manner, for example, when helium is used as a coolant, the coolant should enter the pressure control valve 30 at a temperature of 7 K under a pressure of 1 MPa, and the coolant should be discharged from the pressure control valve 30 under a pressure of about 0.1 MPa. Under these conditions, it is possible to get the liquid helium having a temperature of 4.2 K.

The helium obtained in this manner is stored in the coolant tank 70 and a required amount is transferred to the coil cooling heat exchanger 56, thereby allowing the preamplifier 50 to be cooled down to 4.2 K, with the result that the value Q and signal-to-noise ratio are further improved.

Figure 9:
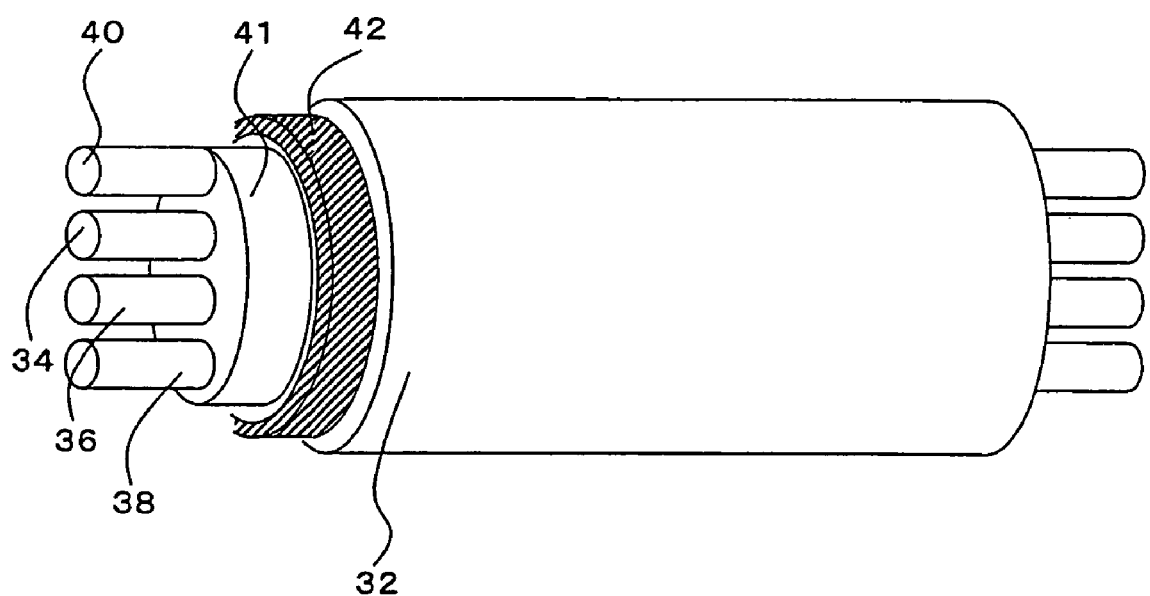
FIG. 9 is a drawing representing the embodiment of another transfer tube and its storage conduit.

FIG. 9 is a drawing representing a still further embodiment of the transfer tube and transfer tube storage conduit. The first transfer tube 34, second transfer tube 36, third transfer tube 38 and fourth transfer tube 40 are installed in a single transfer tube storage conduit 32. The fourth transfer tube 40 is thermally connected with the radiation shield 41. The radiation shield 41 is connected with the third transfer tube 38.

The radiation shield 41 incorporates the first transfer tube 34, second transfer tube 36 and third transfer tube 38. A superinsulator as a multi-heat insulating layer 42 is disposed outside transfer tubes, thereby reducing the radiation heat applied to the transfertube tubes.

A vacuum is created inside transfer tube storage conduit 32 to reduce entry of heat into the transfer tube due to gas convection and heat conduction. This arrangement allows the structure to be simplified, while keeping the performances of the transfer tube storage conduit and its internal structure unchanged.

It is also preferred to use a cryo-cooler different from the cryo-cooler 10 to cool the radiation shield 41, without being connected with the third transfer tube 38 or fourth transfer tube 40.

The present invention described above provides cryogenic cooling of the irradiation coil and reception coil in a probe head, and the preamplifier without damaging a compressor, thereby ensuring a low-temperature probe to be manufactured.

This arrangement makes it possible to provide cryogenic cooling of the irradiation coil and receiver coil in the probe head, and preamplifier, and hence to realize a cryogenic probe.

What is claimed is:

1. A nuclear magnetic resonance measuring apparatus comprising:
- an NMR probe head equipped with an NMR receiver coil and an irradiation coil;
- a preamplifier, arranged in said probe head, for amplifying an NMR signal received by said NMR receiver coil;
- a coil cooling heat exchanger, arranged in said NMR probe head, for exchanging heat between said NMR receiver coil/irradiation coil and a coolant;
- a preamplifier heat exchanger, arranged inside said NMR probe head, for exchanging heat between said preamplifier and the coolant;
- a cooling device including a compressor for cooling and compressing the coolant;
- a first transfer tube for transferring the coolant from said cooling device to said coil cooling heat exchanger in said NMR probe head;
- a second transfer tube for transferring the coolant from said coil cooling heat exchanger in said NMR probe head to said cooling device;
- a third transfer tube for transferring the coolant from said cooling device to said preamplifier heat exchanger in said NMR probe head; and
- a fourth transfer tube for transferring the coolant from said coil cooling heat exchanger in said NMR probe head to said cooling device via said first transfer tube, coil cooling heat exchanger, and second transfer tube.

2. The nuclear magnetic resonance measuring apparatus according to claim 1, wherein said cooling device comprises:
- a cryo-cooler having a first cooling stage which has a first stage heat exchanger and a second cooling stage which has a second stage heat exchanger;
- a compressor for compressing the coolant;
- a first counter-flow heat exchanger; and
- a second counter-flow heat exchanger.

3. The nuclear magnetic resonance measuring apparatus according to claim 2, wherein said first cooling stage has a first stage temperature higher than the second stage temperature of said second cooling stage.

4. The nuclear magnetic resonance measuring apparatus according to claim 2, wherein said compressor is capable of circulating the coolant via a coolant path including said first counter-flow heat exchanger, third transfer tube, preamplifier heat exchanger, fourth transfer tube, first stage heat exchanger, second counter-flow heat exchanger, second stage heat exchanger, first transfer tube, coil cooling heat exchanger, second transfer tube, second counter-flow heat exchanger and first counter-flow heat exchanger, in that order.

5. The nuclear magnetic resonance measuring apparatus according to claim 2, further comprising at least one coolant tank, which is installed between the second heat exchanger and first transfer tube in said coolant path.

6. The nuclear magnetic resonance measuring apparatus according to claim 1, wherein said first transfer tube, second transfer tube third transfer tube and fourth transfer tube are stored inside a transfer tube storage conduit.

7. The nuclear magnetic resonance measuring apparatus according to claim 6, wherein one of said first to fourth transfer tubes are radiation-shielded by a radiation shield and one of said third and fourth transfer tubes shields the other of the transfer tubes in said conduit.

8. The nuclear magnetic resonance measuring apparatus according to claim 6, wherein said first transfer tube, second transfer tube third transfer tube and fourth transfer tube are stored inside a transfer tube storage conduit.

9. The nuclear magnetic resonance measuring apparatus according to claim 8, wherein a radiation shield surrounds said first transfer tube, second transfer tube, third transfer tube and fourth transfer tube in said conduit.

10. A nuclear magnetic resonance measuring apparatus comprising:
- an NMR probe head equipped with an NMR receiver coil and an irradiation coil;
- a preamplifier, arranged in said NMR probe head, for amplifying an NMR signal received by said NMR receiver coil;
- a coil cooling heat exchanger, arranged in said NMR probe head, for exchanging heat between said NMR receiver coil/irradiation coil and a coolant;
- a preamplifier heat exchanger, arranged inside said NMR probe head, for exchanging heat between said preamplifier and the coolant;
- a cooling device including a compressor for cooling and compressing the coolant;
- a first transfer tube for transferring the coolant from said cooling device to said coil cooling heat exchanger in said NMR probe head;
- a second transfer tube for transferring the coolant from said coil cooling heat exchanger in said NMR probe head to said cooling device;
- a third transfer tube for transferring the coolant from said cooling device to said preamplifier heat exchanger in said NMR probe head; and
- a fourth transfer tube for transferring the coolant from said coil cooling heat exchanger in said NMR probe head to said cooling device via said first transfer tube, coil cooling heat exchanger, and second transfer tube;

wherein said cooling device comprises:
- a cryo-cooler having a first cooling stage which has a first stage heat exchanger and a second cooling stage which has a second stage heat exchanger;
- said compressor;
- a first counter-flow heat exchanger; and
- a second counter-flow heat exchanger.

11. The nuclear magnetic resonance apparatus according to claim 10, wherein said first cooling stage has a first stage temperature higher than the second stage temperature of said second cooling stage; and
wherein said compressor is capable of circulating the coolant via a coolant path including said first counter-flow heat exchanger, first stage heat exchanger, third transfer tube, preamplifier heat exchanger, fourth transfer tube, second counter-flow heat exchanger, second stage heat exchanger, first transfer tube, coil cooling heat exchanger, second transfer tube, second counter-flow heat exchanger and first counter-flow heat exchanger, in that order.

12. The nuclear magnetic resonance apparatus according to claim 11, which further comprises at least one coolant tank, which is installed between said second heat exchanger and first transfer tube along said coolant path.

13. A nuclear magnetic resonance apparatus comprising:
- an NMR probe head equipped with an NMR receiver coil and an irradiation coil;
- a preamplifier, arranged in said probe head, for amplifying an NMR signal received by said NMR receiver coil;
- a coil cooling heat exchanger, arranged in said NMR probe head, for exchanging heat between said NMR receiver coil/irradiation coil and a coolant;
- a preamplifier heat exchanger, arranged inside said NMR probe head, for amplifying an NMR signal received by said NMR receiver coil;
- a cooling device including a compressor for cooling and compressing the coolant;

a first transfer tube for transferring the coolant from said cooling device to said coil cooling heat exchanger in said NMR probe head;
a second transfer tube for transferring the coolant from said coil cooling heat exchanger in said NMR probe head to said cooling device;
a third transfer tube for transferring the coolant from said cooling device to said preamplifier heat exchanger in said NMR probe head; and
a fourth transfer tube for transferring the coolant from said coil cooling heat exchanger in said NMR probe head to said cooling device via said first transfer tube, coil cooling heat exchanger, and second transfer tube;
wherein said cooling device comprises:
a cryo-cooler having a first cooling stage which has a first stage heat exchanger and a second cooling stage which has a second stage heat exchanger;
said compressor;
a first counter-flow heat exchanger; and
a second counter-flow exchanger;
wherein said first cooling stage has a first stage temperature higher that the second stage temperature of said second cooling stage; and
wherein said compressor is capable of circulating the coolant via a coolant path including said first counter-flow heat exchanger, first stage heat exchanger, second counter-flow heat exchanger, second stage heat exchanger, first transfer tube, coil cooling heat exchanger, second transfer tube, second counter-flow heat exchanger, third transfer tube, preamplifier heat exchanger, fourth transfer tube and first stage heat exchanger, in that order;
wherein said first transfer tube, second transfer tube, third transfer tube and fourth transfer tube are incorporated into a single transfer tube storage conduit; and
wherein one of said third transfer tube and fourth transfer tube covers the other of said transfer tubes in said conduit.

14. The nuclear magnetic resonance measuring apparatus according to claim 13, which further comprises at least one coolant tank, which is installed between the second heat exchanger and first transfer tube along said coolant path.

15. A nuclear magnetic apparatus comprising:
an NMR probe head equipped with an NMR receiver coil and an irradiation coil;
a preamplifier, arranged in said NMR probe head, for amplifying an NMR signal received by said NMR receiver coil;
a coil cooling heat exchanger, arranged in said NMR probe head, for exchanging heat between said NMR receiver coil/irradiation coil and coolant;
a preamplifier heat exchanger, arranged in said NMR probe head, for exchanging heat between said preamplifier and coolant;
a cooling device, including a compressor, for cooling and compressing the coolant;
a first transfer tube for transferring the coolant from said cooling device to said coil cooling heat exchanger in said NMR probe head;
a second transfer tube for transferring the coolant from said coil cooling heat exchanger in said NMR probe head to said cooling device;
a third transfer tube for transferring the coolant from said cooling device to said preamplifier heat exchanger in said NMR probe head; and
a fourth transfer tube for transferring the coolant from said coil cooling heat exchanger in said NMR probe head to said cooling device via said first transfer tube, coil cooling heat exchanger, and second transfer tube;
wherein said cooling device comprises:
a cryo-cooler having a first cooling stage which has a first stage heat exchanger and a second cooling stage which has a second stage heat exchanger;
said compressor;
a first counter-flow exchanger;
a second counter-flow heat-exchanger; and
a third counter-flow heat exchanger;
wherein said first cooling stage has a first stage temperature higher than the second stage temperature of said second cooling stage;
wherein said compressor is capable of circulating the coolant in a first and second coolant paths in parallel;
wherein said first coolant path includes said first counter-flow heat exchanger, first stage heat exchanger, second counter-flow heat exchanger, second stage heat exchanger, first transfer tube, coil cooling heat exchanger, second transfer tube, second counter-flow heat exchanger and first counter-flow heat exchanger, in that order;
wherein said second coolant path branches off from said first coolant path, at the coolant branching point provided between said compressor and first counter-flow heat exchanger in said first coolant path, said second coolant path being the path where the coolant is fed through said third counter-flow heat exchanger, first stage heat exchanger, third transfer tube, preamplifier heat exchanger, fourth transfer tube and third counter-flow heat exchanger in that order and meets said first coolant path at a coolant confluent point provided between said first counter-flow heat exchanger and compressor in said first coolant path;
wherein said first transfer tube, second transfer tube, third transfer tube and fourth transfer tube are incorporated into a single transfer tube storage conduit; and
wherein one of said third transfer tube and fourth transfer tube is thermally connected to a radiation shield covering said first to fourth transfer tubes, one of said third and fourth tubes that surrounds the other of said first to fourth transfer tubes in said conduit having a tubular form through which the coolant flows.

16. A nuclear magnetic apparatus comprising:
an NMR probe head equipped with an NMR receiver coil and an irradiation coil;
a preamplifier, arranged in said NMR probe head, for amplifying an NMR signal received by said NMR receiver coil;
a coil cooling heat exchanger, arranged in said NMR probe head, for exchanging heat between said NMR receiver coil/irradiation coil and a coolant;
a preamplifier heat exchanger, arranged inside said NMR probe head, for exchanging heat between said preamplifier and the coolant;
a preamplifier heat exchanger, arranged inside said NMR probe head, for exchanging heat between said preamplifier and the coolant:
a cooling device, including a compressor, for cooling and compressing the coolant;
a first transfer tube for transferring the coolant from said cooling device to said coil cooling heat exchanger in said NMR probe head;
a second transfer tube for transferring the coolant from said coil cooling heat exchanger in said NMR probe head to said cooling device;
a third transfer tube for transferring the coolant from said cooling device to said preamplifier heat exchanger in said NMR probe head; and
a fourth transfer tube for transferring the coolant from said coil cooling heat exchanger in said NMR probe head to said cooling device via said first transfer tube, coil cooling heat exchanger, and second transfer tube;

wherein said cooling device comprises:
a cryo-cooler having a first cooling stage which a first stage heat exchanger and a second cooling stage which has a second stage heat exchanger;
said compressor;
a first counter-flow heat exchanger and
a second counter-flow heat exchanger;
a third-counter flow heat exchanger;
wherein said first cooling stage has a first stage temperature higher than the second stage temperature of said second cooling stage;
wherein said compressor is capable of circulating the coolant via a coolant path including said first counter-flow heat exchanger, second stage heat exchanger, first transfer tube, coil cooling heat exchanger, second transfer tube and first counter-flow heat exchanger, in that order;
wherein said first transfer tube, second transfer tube, third transfer tube and fourth transfer tube are stored in a single transfer tube storage conduit; and
wherein one of said third transfer tube and fourth transfer tube covers the other of said transfer tubes in said conduit.

17. The nuclear magnetic resonance measuring apparatus according to claim 16, which further comprises at least one coolant tank, which is installed at a desired position between the second stage heat exchanger and second counter-flow heat exchanger along the coolant path for the coolant.

18. A nuclear magnetic apparatus comprising:
an NMR probe head equipped with an NMR receiver coil and an irradiation coil;
a preamplifier, arranged in said NMR probe head, for amplifying an NMR signal received by said NMR receiver coil;
a coil cooling heat exchanger, arranged in said NMR probe head, for exchanging heat between said NMR receiver coil/irradiation coil and a coolant;
a preamplifier heat exchanger, arranged in said NMR probe head, for exchanging heat between said preamplifier and the coolant;
a cooling device including a compressor for cooling and compressing the coolant;
a first transfer tube for transferring the coolant from said cooling device to said coil cooling heat exchanger in said NMR probe head;
a second transfer tube for transferring the coolant from said coil cooling heat exchanger in said NMR probe head to said cooling device;
a third transfer tube for transferring the coolant from said cooling device to said preamplifier heat exchanger in said NMR probe head; and
a fourth transfer tube for transferring the coolant from said coil cooling heat exchanger in said NMR probe head to said cooling device via said first transfer tube, coil cooling heat exchanger, and second transfer tube;
wherein said cooling device comprises:
a cryo-cooler having a first cooling stage which has a first stage heat exchanger and a second cooling stage which has a second stage heat exchanger;
said compressor;
a first counter-flow exchanger;
a second counter-flow exchanger; and
a third-counter flow heat exchanger;
wherein said first cooling stage has a first stage temperature higher than the second stage temperature of the second cooling stage;
wherein said compressor is capable of circulating the coolant via a coolant path including said first counter-flow heat exchanger, first heat exchanger, second counter-flow heat exchanger, second stage heat exchanger, first transfer tube, coil cooling heat exchanger, second transfer tube, second counter-flow heat exchanger and first counter-flow heat exchanger, in that order;
wherein said first transfer tube, second transfer tube, third transfer tube and fourth transfer tube are incorporated into a single transfer tube storage conduit; and
wherein one of said third transfer tube and fourth transfer tube is connected to a radiation shield covering all of said transfer tubes, one of said third and fourth transfer tubes having a double tubular form through which the coolant flows.

19. The nuclear magnetic resonance measuring apparatus according to claim 18, which further comprises at least one coolant tank, which is installed at a desired position between the second stage heat exchanger and second counter-flow heat exchanger along the coolant path for the coolant.

20. The nuclear magnetic resonance apparatus according to claim 18, which further comprises a second cooler different from said cryo-cooler, which is installed at a position other than said coolant path, and heat exchange is performed between the coolant cooled by said second cooler and said preamplifier through said preamplifier heat exchanger.

21. The nuclear magnetic resonance apparatus according to claim 18, which further comprises a second coolant tank different from said coolant tank, which is installed at a position other than said coolant path, and heat exchange is performed between the coolant stored in said second coolant tank and said preamplifier through a preamplifier heat exchanger.

22. A nuclear magnetic resonance measuring apparatus comprising:
an NMR probe head equipped with an NMR receiver coil and an irradiation coil;
a preamplifier, arranged in said probe head, for amplifying an NMR signal received by said NMR receiver coil;
a coil cooling heat exchanger, arranged in said NMR probe head, for exchanging heat between said NMR receiver coil/irradiation coil and a coolant;
a preamplifier heat exchanger, arranged inside said NMR probe head, for exchanging heat between said preamplifier and the coolant;
a cooling device including a compressor for cooling and compressing the coolant;
a first transfer tube for transferring the coolant from said compressor of said cooling device to said coil cooling heat exchanger in said NMR probe head;
a second transfer tube for transferring the coolant from said coil cooling heat exchanger in said NMR probe head to said cooling device;
a third transfer tube for transferring the coolant from said cooling device to said preamplifier heat exchanger in said NMR probe head; and
a fourth transfer tube for transferring the cooling from said coil cooling heat exchanger in said NMR probe head to said cooling device via said first to fourth transfer tubes,
wherein one of at least two of the transfer tubes are surrounded by a radiation-shield and one of said third or fourth transfer tubes is in a single transfer tube storage conduit.

23. The nuclear magnetic resonance measuring apparatus according to claim 22, wherein said radiation shield and one of said third and fourth transfer tubes have a double tubular form.

* * * * *